United States Patent
Xu et al.

(10) Patent No.: US 9,437,388 B2
(45) Date of Patent: Sep. 6, 2016

(54) METHOD AND SYSTEM FOR DYNAMIC IN-SITU PHOSPHOR MIXING AND JETTING

(75) Inventors: Tao Xu, Fremont, CA (US); Rene Helbing, Sunnyvale, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 13/099,244

(22) Filed: May 2, 2011

(65) Prior Publication Data

US 2011/0203522 A1    Aug. 25, 2011

Related U.S. Application Data

(62) Division of application No. 12/628,730, filed on Dec. 1, 2009, now Pat. No. 7,998,526.

(51) Int. Cl.
*B05C 11/10* (2006.01)
*H01J 9/22* (2006.01)

(52) U.S. Cl.
CPC ........ *H01J 9/223* (2013.01); *H01L 2933/0041* (2013.01)

(58) Field of Classification Search
CPC ........................... H01J 9/223; B05C 11/1034
USPC ........ 118/712, 713, 313–315, 665–667, 695, 118/696, 688–690; 427/64, 8, 71, 427
See application file for complete search history.

(56) References Cited

U.S. PATENT DOCUMENTS

| | | | |
|---|---|---|---|
| 5,687,092 A * | 11/1997 | Bretmersky et al. | 702/100 |
| 2004/0135504 A1 | 7/2004 | Tamaki et al. | |
| 2005/0042381 A1 * | 2/2005 | Weiss et al. | 427/421.1 |
| 2006/0029724 A1 | 2/2006 | Babiarz et al. | |
| 2006/0071589 A1 | 4/2006 | Radkov | |
| 2006/0091790 A1 | 5/2006 | Nagatomi et al. | |

(Continued)

FOREIGN PATENT DOCUMENTS

| | | |
|---|---|---|
| JP | 2006093108 A | 4/2006 |
| JP | 2007066969 A | 3/2007 |

(Continued)

OTHER PUBLICATIONS

The International Search Report and the Written Opinion of the International Application No. PCT/US2010/058568 dated Feb. 2, 2011.

(Continued)

*Primary Examiner* — Yewebdar Tadesse
(74) *Attorney, Agent, or Firm* — Arent Fox LLP

(57) ABSTRACT

A system and method for depositing a phosphor composition onto a light emitting device improves manufacturing yield, simplifies conventional processes, and decreases costs. For example, a method of dispensing a phosphor composition onto a light emitting device includes dispensing a portion of the phosphor composition onto the light emitting device utilizing a plurality of colored phosphor dispensers each for dispensing a respective type of phosphor. Power is applied to the light emitting device to emit light, and a characteristic the light emitted by the light emitting device is detected. Phosphor mixing and phosphor dispensing are dynamically controlled. Therefore the color characteristics of phosphor dispensed on LEDs are consistent. The system and method may also reduce the difference between detected characteristic of the light and a desired characteristic of the light.

12 Claims, 3 Drawing Sheets

(56) References Cited

U.S. PATENT DOCUMENTS

| | | | |
|---|---|---|---|
| 2006/0165878 A1* | 7/2006 | Kim et al. | 427/58 |
| 2007/0096128 A1 | 5/2007 | Fukudome et al. | |
| 2008/0265263 A1 | 10/2008 | Keuper et al. | |
| 2008/0272385 A1 | 11/2008 | Wu et al. | |
| 2009/0117672 A1* | 5/2009 | Caruso et al. | 438/7 |
| 2009/0243467 A1 | 10/2009 | Shimizu et al. | |
| 2011/0018026 A1* | 1/2011 | Konno et al. | 257/100 |

FOREIGN PATENT DOCUMENTS

| | | |
|---|---|---|
| JP | 2009260244 A | 11/2009 |
| TW | 200627662 A | 8/2006 |
| TW | 200701520 A | 1/2007 |
| TW | 200916557 A | 4/2009 |
| WO | 2009118985 A2 | 10/2009 |

OTHER PUBLICATIONS

Translation of Office Action in Chinese application 201080054614.8 date of mailing Oct. 29, 2013.

Translation of Office Action in Japanese application 2012542159 date of mailing Sep. 24, 2013.

English Translation of Decision of Final Rejection re Japanese Patent Application No. 2012-542159, date of mailing Jan. 7, 2014.

Notice of Grounds for Rejection dated Nov. 7, 2013 regarding Korean Patent Application No. 2012-7016767.

Notice of Grounds for Rejection dated Jun. 27, 2014 regarding Korean Patent Application No. 2012-7016767.

Reexamination Report dated Jun. 23, 2014, regarding Japan Patent Application No. 2012-542159 (Appeal Case No. 2014-008182).

Office Action and Search Report dated Dec. 2013 regarding Taiwan Patent Application No. TW99141659.

Second China Office Action dated Jun. 13, 2014 regarding China Application No. CN201080054614.8.

Rejection Decision dated May 6, 2015 regarding China Application No. CN201080054614.8.

Decision in Appeal dated Mar. 3, 2015 regarding JP Application No. JP2012-542159 (Appeal No. 2014-8182), and English translation.

Notice of Final Rejection dated Mar. 6, 2015 regarding Korean Patent Application No. KR2012-7016767, and English translation.

Third Office Action dated Oct. 24, 2014, regarding Chinese Application No. CN201080054614.8.

Notice of Final Rejection dated Dec. 30, 2014, regarding Korean Application No. KR2012-7016767.

Notice of Grounds for Rejection dated Sep. 4, 2015 regarding Korean Application No. KR2015-7015233.

Notice of Grounds for Rejection dated Sep. 4, 2015 regarding Korean Application No. KR2015-7015234.

Board Opinion dated Feb. 23, 2016, regarding China Application No. 201080054614.8, and English translation.

Notice of Final Rejection dated Mar. 30, 2016, regarding Korean Application No. KR2015-7015234 and English translation.

Notice of Final Rejection dated Mar. 30, 2016, regarding Korean Application No. KR2015-7015233 and English translation.

Notice of Final Rejection dated May 30, 2016 regarding Korean Patent Application No. 2015-7015233, and English translation.

\* cited by examiner

METHOD AND SYSTEM FOR DYNAMIC IN-SITU PHOSPHOR MIXING AND JETTING

CROSS-REFERENCE TO RELATED APPLICATION(S)

This application is a divisional of U.S. patent application Ser. No. 12/628,730, filed Dec. 1, 2009, the contents of which are hereby incorporated by reference herein in their entirety.

BACKGROUND

1. Field

The present disclosure relates to the manufacture of light emitting devices, and more particularly, to the manufacture of broad-spectrum light emitting diodes having a phosphor layer.

2. Background

Solid state devices, such as light emitting diodes (LED)s, are attractive candidates for replacing conventional light sources such as incandescent and fluorescent lamps. LEDs have substantially higher light conversion efficiencies than incandescent lamps and longer lifetimes than both types of conventional light sources. In addition, some types of LEDs now have higher conversion efficiencies than fluorescent light sources and still higher conversion efficiencies have been demonstrated in the laboratory. Finally, LEDs require lower voltages than fluorescent lamps, and therefore, provide various power saving benefits.

Unfortunately, LEDs produce light in a relatively narrow spectrum. To replace conventional lighting systems, LED-based sources that produce white light are desired. One way to produce white light is to deposit a phosphor material on the LEDs, such that monochromatic light emitted from blue or UV LEDs is converted to broad-spectrum white light. The phosphor material may be formed by mixing a phosphor powder into a polymer such as silicone at a pre-defined concentration, or with a pre-defined recipe, resulting in a suspension of phosphor particles in the silicone. This mixture is then deposited onto the LED at a pre-defined volume and/or weight, and subsequently subjected to a curing procedure. The resulting phosphor-coated LEDs are then tested and put into different color bins according to the actual tested color. Various processes for suspending phosphor particles in silicone carriers are known in the art.

Using these processes, it is difficult to achieve consistent optical properties, such as color consistency. Often, due to the process of suspending the phosphor particles in the carrier, the uniformity of light across large numbers of LEDs is difficult to maintain. Operator error may result in the wrong mixture, leading to an off-color failure of the whole lot. Further, the viscosity of the phosphor mixture may change during deposition, or the phosphor suspension may settle at pot life, causing a wide range of color bins. Moreover, other factors such as the chip wavelength, the phosphor profile, the substrate reflectivity, etc., can also cause variation even when the dispensing volume and weight are consistent. The above issues generally can not be caught in real-time, and thus, when they are discovered during testing it is too late to recover the parts and they must be scrapped. The manufacturing process itself is often time consuming and costly, requiring multiple fabrication steps to complete. All of these issues lead to increased cost in manufacturing of broad-spectrum LEDs.

Accordingly, there is a need in the art for simplified and improved processes for applying a phosphor material to LEDs and other solid state lighting devices.

SUMMARY

In various representative aspects, the present disclosure provides for a method of dispensing a phosphor composition onto a light emitting device. According to an exemplary method, expected characteristics of the light, such as a correlated color temperature (CCT) and/or a set of coordinates in a color space (e.g., the CIE 1931 color space), and an expected total dispensing volume or weight of the phosphor composition, are input into a controller. A first amount of the phosphor composition is dispensed onto a surface of the light emitting device utilizing a plurality of jetting heads, the jetting heads including substantially pure silicone jetting head for dispensing substantially pure silicone and a plurality of colored phosphor jetting heads, each for dispensing a respectively colored phosphors.

After the first amount of the phosphor composition is dispensed, a pulsed power is applied to the light emitting device, causing the light emitting device to emit light, which is then detected with a light detector. Characteristics of the detected light are compared with the expected characteristics, and if needed, the relative dispensing of the pure silicone and the at least one colored phosphor are adjusted to move the detected characteristics toward the expected characteristics. The process is repeated, and when the detected characteristic of the light is within a predetermined range of the desired characteristic of the light and also an amount of the phosphor composition on the surface of the light emitting device meets or exceeds the expected total dispensing volume, dispensation of the phosphor composition ceases.

In some embodiments, a method of dispensing a phosphor composition onto a light emitting device includes dispensing a portion of the phosphor composition onto the light emitting device. A characteristic the light emitted by the light emitting device is detected, and relative amounts of respective portions of the phosphor composition are adjusted to reduce a difference between the detected characteristic of the light and a desired characteristic of the light.

In some embodiments, a system for dispensing a phosphor composition onto a light emitting device includes a light sensor for detecting a characteristic of light emitted from the light emitting device and a plurality of phosphor dispensers for dispensing a respective color phosphor and pure silicone onto a surface of the light emitting device. The phosphor and the silicone dispensers are adapted to be controlled in response to the detected characteristic of the light emitted from the light emitting device.

In some embodiments, a computer-readable medium stores a computer program which, when executed by a computer, causes the computer to perform a process for manufacturing a light emitting device. The computer program includes code for dispensing a portion of the phosphor composition onto the light emitting device, code for detecting a characteristic of light emitted by the light emitting device, and code for adjusting relative amounts of respective portions of the phosphor composition to reduce a difference between the detected characteristic of the light and a desired characteristic of the light.

These and other aspects of the invention are more fully comprehended upon review of this disclosure.

BRIEF DESCRIPTION OF THE DRAWINGS

The accompanying drawings, together with the specification, illustrate exemplary embodiments of the present invention, and, together with the description, serve to explain the principles of the present invention.

Figure 1:
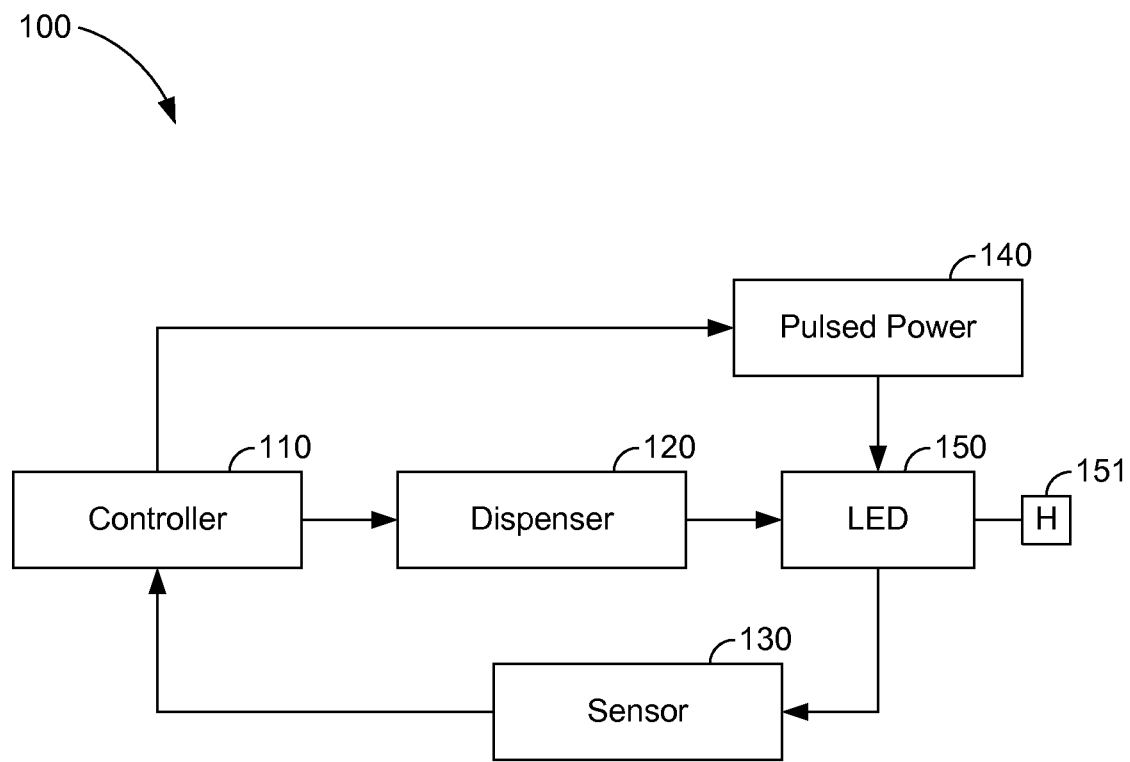
FIG. 1 is a block diagram illustrating a system for dispensing a phosphor composition onto a light emitting device.

Elements and steps in the figures are illustrated for simplicity and clarity and have not necessarily been rendered according to any particular sequence. For example, steps that may be performed concurrently or in different order are illustrated in the figures to help to improve the understanding of embodiments of the present invention.

DETAILED DESCRIPTION

In the following detailed description, only certain exemplary embodiments of the present invention are shown and described, by way of illustration. As those skilled in the art would recognize, the invention may be embodied in many different forms and should not be construed as being limited to the examples set forth herein. Also, in the context of the present disclosure, when an element is referred to as being "on" or dispensed "onto" another element, it can be directly on the other element or be indirectly on the other element with one or more intervening elements interposed therebetween.

Certain aspects of the present invention may be described herein in terms of functional block components and various processing steps. Such functional blocks may be realized by any number of hardware or software components configured to perform the specified functions and achieve the various results. For example, a controller is described for performing certain calculations, making decisions, and providing control signals. Such a controller may be implemented in hardware and/or software, and the functions described may be embodied in a computer-readable medium that stores a computer program which, when executed by a computer, causes the computer to perform the described functions.

In addition, the present invention may be practiced in conjunction with the manufacture of any number of devices in addition to light emitting devices, and the system described is merely one exemplary application for the invention.

Further, the present invention may employ any number of conventional techniques for programming control points, sensing characteristics of light, calculating and adjusting properties of a composition, and the like.

Like reference numerals designate like elements throughout the specification.

Conventional systems and methods for manufacturing light emitting devices having a phosphor composition include pre-mixing a phosphor powder in silicone to make the phosphor composition utilizing a predetermined recipe with an aim to achieve a broad-spectrum "white" light. That is, a typical LED produces light in a relatively narrow spectrum, while white light is frequently desired for lighting purposes. Thus, a conventional process typically includes predetermining a recipe for the phosphor composition based on knowledge of the properties of the phosphor constituents of the composition, knowledge of the spectrum of radiation emitted by the LED, and other factors that may affect the emitted spectrum, with an aim for a complementary additive mixing of the emitted light from the excited phosphors and the LED to result in a perception of white light. This phosphor composition is then deposited on the LED at a predetermined volume and/or weight and cured, and the resulting phosphor-coated LEDs are then tested. Based on the spectrum measured from each individual LED, the LEDs are generally placed into different bins or categories, for example, separating the devices based on the correlated color temperature (CCT) and/or a set of coordinates in a color space, such as a CIE color space.

Using these conventional processes, it is difficult to achieve consistent optical properties. Often, due to the process of suspending the phosphor particles in the carrier, the uniformity of light across the LEDs is difficult to maintain. Operator error may result in the wrong mixture, leading to an off-color failure of the whole lot. Further, the phosphor suspension may settle at pot life, or the viscosity of the phosphor mixture may change, causing a wide range of color bins. Moreover, other factors such as the chip wavelength, the phosphor profile, the substrate reflectivity, etc. can also cause variation even when the dispensing volume and weight are consistent. The above issues generally can not be caught in real-time, and thus when they are discovered during testing it is too late to recover the parts and they must be scrapped.

A process according to an aspect of this disclosure avoids a number of these and other issues by utilizing feedback during the dispensation of the phosphor to dynamically control the relative amounts of the phosphor composition dispensed onto a light emitting device such as an LED.

Methods and systems for manufacturing a light emitting device may operate in conjunction with a production system 100. FIG. 1 illustrates a production system 100 according to an exemplary embodiment, including a controller 110, a dispenser 120, a sensor 130, a power supply 140, and a light emitting device 150.

The controller 110 may be a microprocessor or other computer, a programmable gate array, an application specific circuit, or any other type of controller with calculation, input, and output functions and a capability to execute stored instructions, perform predetermined actions, etc.

The sensor 130 may be an optical sensor or other measurement sensor capable of detecting one or more characteristics of light emitted by the light emitting device 150, such as a correlated color temperature and/or color points (i.e., a set of coordinates in a color space). For example, the sensor 130 may be a charge coupled device (CCD), a colorimeter, or any other suitable sensor known to those skilled in the art. The sensor 130 may include a combination of a sensing device and the controller 110. The sensor 130 may include a fiber light guide for guiding light from the light emitting device to the sensor. The sensor 130 may send information, such as the one or more characteristics of the light, to an input of the controller 110.

The dispenser 120 may be coupled to an output of the controller 110, such that the controller 110 provides a signal to the dispenser 120 to control the dispenser 120. The dispenser may include one or more of various silicone and phosphor dispensers, e.g., thermal jets, piezoelectric jets, continuous jets, squeeze tubes, syringes, and the like, which may carry out a variety of functions. The dispenser 120 may include one or more jetting dispensers for jetting droplets of respective colors of phosphor onto a surface of the light emitting device.

For example, in an exemplary embodiment, the dispenser 120 includes a yellow jetting dispenser for dispensing yellow phosphor, a green jetting dispenser for dispensing green phosphor, and a red jetting dispenser for dispensing red phosphor. In a further embodiment, the jetting dispensers for dispensing the colored phosphors are configured to jet a high concentration (e.g., a suspension of greater than 30 wt %, approximately 50 wt %, or approximately 80 wt %) of their respective color phosphor powder suspended in a substantially transparent medium such as silicone.

The dispenser 120 may further include a substantially pure silicone dispenser, e.g., a silicone jetting head, for dispensing substantially transparent or clear silicone onto the surface of the light emitting device, in conjunction with the colored phosphor dispensers. The dispenser 120 may further include a plurality of reservoirs for storing the concentrated phosphor suspensions and the transparent silicone in liquid form for later dispensation.

In some embodiments, each of the dispensers or heads (e.g., the jetting heads) of the dispenser 120 are configured to dispense droplets of pure silicone or high-concentration colored phosphors, respectively, at individually variable and controllable rates and/or for individually variable and controllable amounts of time to yield a phosphor composition, including the several colors of phosphor powder, the pure silicone, and, in some embodiments, other constituents. The jetting heads may dispense droplets with volumes ranging from 1 nanoliter to hundreds of milliliters, or may dispense respective portions of the phosphor composition as a constant stream. The dispensation of portions of the pure silicone and various colors of concentrated phosphor may be offset relative to each other in time, or may be at substantially the same time. Further, the precise location that each of the dispensers actually dispenses its respective portion of the phosphor composition on the surface of the light emitting device may be at the same or different locations from one another.

The dispenser 120 may be configured for jetting the phosphor composition in at least a partial vacuum. In this way, the need for de-gassing and/or mixing of the phosphor composition after dispensation may be reduced or eliminated.

A system as described above reduces or eliminates the separate processing step of mixing the phosphor composition to a predetermined ratio of colored, powdered phosphors and silicone, as the respective colors and the silicone are "mixed" in situ as they are dispensed, for example, on the surface of the light emitting device. Thus, the ratio of the components of the mixed phosphor composition may be precisely controlled and varied as the phosphor composition is dispensed. Furthermore, the ratio of the components of the mixed phosphor composition may be different from lot to lot, or even from device to device, but as discussed above, because other factors besides the phosphor composition can affect the resultant light spectrum, the devices and lots may have precisely controlled and uniform color characteristics.

Furthermore, the above-described system enables the creation of variously layered or patterned phosphor structures on any surface, including a surface of a light emitting device.

The light emitting device 150, or the platform where the light emitting device 150 is located, may include a heating element 151. The heating element 151 enables the phosphor composition to be cured during dispensation or closely thereafter, to reduce or eliminate issues related to settling of the suspension of phosphor powder in the silicone. Furthermore, the heating element enables control over the viscosity of the phosphor composition, for example, by heating the composition to reduce its viscosity and to enable the composition to flow more evenly and/or quickly over the surface of the light emitting device 150.

The power supply 140 may supply power to the light emitting device 150. The controller 110 may provide a control signal for controlling the power supply 140, or the power supply 140 may operate independently of the controller 110. The power supply 140 may provide a voltage/current to the light emitting device 150, the voltage/current being constant (DC), alternating (AC), or pulsed. In embodiments where the power supply 140 provides a pulsed power, the pulses may be controlled in their amplitude, their high and/or low peak voltage/current, their period, frequency, and/or their duty cycle. Further, the light emitting device 150 may include one or a plurality of light emitting devices, and the power supply 150 may provide power to the one or any number of the plurality of light emitting devices. In embodiments where the light emitting device 150 includes a plurality of light emitting devices, the power supply 150 may provide individually controllable power to one or more (i.e., any subset up to and including all) of the plurality of light emitting devices.

Figure 2:
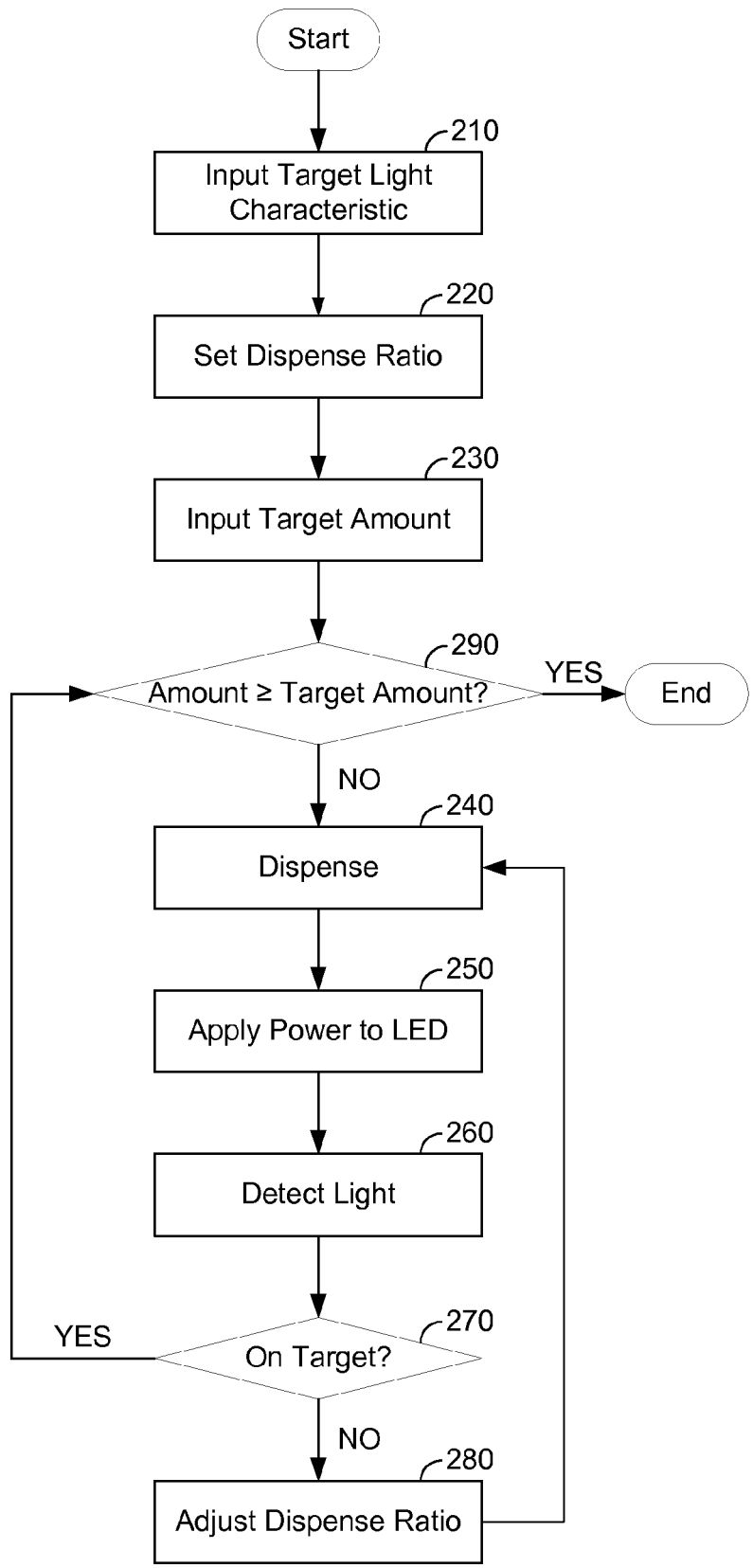
FIG. 2 is a flow chart illustrating a process for dispensing a phosphor composition onto a light emitting device.

FIG. 2 is a flow diagram illustrating an exemplary process of dispensing a phosphor composition onto a light emitting device. The process may be performed by circuitry, a network processor, a computer-controlled dispensing system with feedback, or by some other suitable means. For example, the process may be performed by the system of FIG. 1.

Referring together now to FIGS. 1 and 2, in block 210, a target light characteristic may be inputted into the system. The inputting of the target light characteristic may be accomplished by an operator entering one or more desired characteristics of light emitted by the light emitting device into a user interface such as a keyboard or touch-screen interface coupled to the controller 110. The target light characteristics may be stored in memory such as a ROM, a magnetic storage, or an EEPROM, or in a volatile memory such as RAM. Some examples of target light characteristics include a correlated color temperature (CCT) and color coordinates (e.g., coordinates in a color space, such as CIE x and CIE y). The target light characteristic or characteristics entered in the system may further include a range, allowing for a tolerance of certain errors in meeting the target characteristics of the light.

In block 220, a dispense ratio may be set. That is, the dispenser 120 may include a plurality of dispense heads, some of which may be adapted to dispense colored phosphors. In an exemplary embodiment, three dispense heads are adapted to dispense red, yellow, or green phosphor, respectively, wherein the red, yellow, or green phosphor may be a high concentration (e.g., greater than about 30%) of phosphor powder in a suspension in a medium such as silicone. Here, a dispense ratio corresponds to relative amounts of the different colors of phosphor. For example, a dispense ratio might be 2:2:1, that is, 2 parts red phosphor to 2 parts yellow phosphor to 1 part green phosphor.

The dispense ratio may further include a portion of the phosphor composition from a fourth dispense head in the dispenser 120, including a transparent or clear medium such as silicone. That is, the dispense ratio in an exemplary embodiment may be 2:2:1:1, that is, 2 parts red phosphor to 2 parts yellow phosphor to 1 part green phosphor to 1 part silicone. In some embodiments, the dispense ratio may be controllable to very fine precision, and in some embodiments, a discrete and small number of dispense ratios may be available.

On the other hand, a process according to various exemplary embodiments may forgo the initial setting of the dispense ratio in block 220. That is, in embodiments including feedback control and automatic correction of the dispense ratio, to be discussed in further detail below, the initialization of the dispense ratio may not be necessary. Thus, the initial dispense ratio may be the same initial value each time the process is run, or the initial dispense ratio may be whatever ratio was last utilized by the system, or, in some embodiments, the initial dispense ratio may be any value.

In block 230, a target amount of phosphor composition may be set. That is, the system may be provided with a predetermined amount (e.g., a weight or a volume) of the phosphor composition to be dispensed by the dispenser 120 onto one or a plurality of light emitting devices 150. This target amount may be utilized later in the process, as described below, as one criterion for determining when to end the dispensation of the phosphor composition. The target amount may be pre-set at a factory, manually entered by an operator into the controller 110, or loaded from a communications interface coupled to the controller 110.

Skipping over block 290, to be described below, in block 240, the dispenser 120 may dispense a portion of the phosphor composition onto the light emitting device 150. The amount of the phosphor composition actually dispensed in a particular iteration of block 240 may be controlled and limited to a predetermined amount, for example, a predetermined weight or a volume. The dispenser 120 may further include a heater and/or cooler for controlling the temperature, and therefore the viscosity of the phosphor composition being dispensed onto the light emitting device 150. This enables improved control of the amount being dispensed in step 240.

Block 240 may include further sub-processes including positioning of the light emitting device 150 and/or the dispensing heads in the dispenser 120, baking and/or curing the light emitting device 150 by utilizing the heater 151 after dispensation of the phosphor composition, or waiting for a period of time after dispensation. In various embodiments that include a heater 151 and a heating sub-process, rapidly curing the phosphor and/or silicone droplets after dispensation may reduce or eliminate phosphor settling, thus improving the predictability and consistency of the phosphor profile and thereby reducing variability in the end product.

In block 250, power may be applied to the light emitting device 150, e.g., the LED. For example, a direct-current voltage may be applied on two terminals to forward-bias an LED, resulting in a current through the LED and the emission of light. The power may be a pulsed power, for example, where the applied voltage takes the form of a square-wave. Here, the light emitted from the LED flickers according to the amplitude, phase, pulse width, frequency, and duty cycle of the pulsed power. In embodiments including a pulsed power supply, the current driven through the LED may be reduced in comparison to a DC current, and heating of the LED is concomitantly reduced.

In block 260, light emitted from the light emitting device 150 may be detected. For example, in some embodiments a sensor 130 senses the light and communicates at least one characteristic of the light to the controller 110. The sensor 130 may be in close proximity to the light emitting device or devices, or the sensor may not be in the immediate proximity, and a light guide, for example, one or more fiber light guides may be utilized to guide light from the light emitting device or devices 150 to the sensor 130. As discussed above, the at least one characteristic of the light may include a correlated color temperature and/or a set of coordinates in a color space.

In block 270, the process may determine whether the at least one characteristic of the light detected in block 260 is at or near the target characteristic set in step 210. That is, the controller 110 may perform a comparison between the detected characteristic determined by the sensor 130 and the target characteristic entered into the controller 110. The comparison may be performed with a hardware comparator, a difference amplifier, or software. Further, the target utilized for the comparison may include a hard threshold, or the comparison may be weighted depending on a number of factors, including but not limited to the amount of the phosphor composition already dispensed.

If the detected characteristic compares unfavorably to the target characteristic, that is, if the light is off target, or the difference between the detected characteristic and the target characteristic is greater than a predetermined threshold, the process may branch to block 280. However, if the detected characteristic compares favorably to the target characteristic, that is, the light is on target, or the difference between the detected characteristic and the target characteristic is less than a predetermined threshold, the process may branch to block 290.

In block 280, the process may adjust the dispense ratio. For example, the controller 110 may send an instruction to the dispenser 120 to adjust the relative amounts of concentrated colored phosphor suspension and/or transparent silicone in order to "move" the characteristics of the light emitted from the light emitting device "closer" to the target characteristics.

Figure 3:
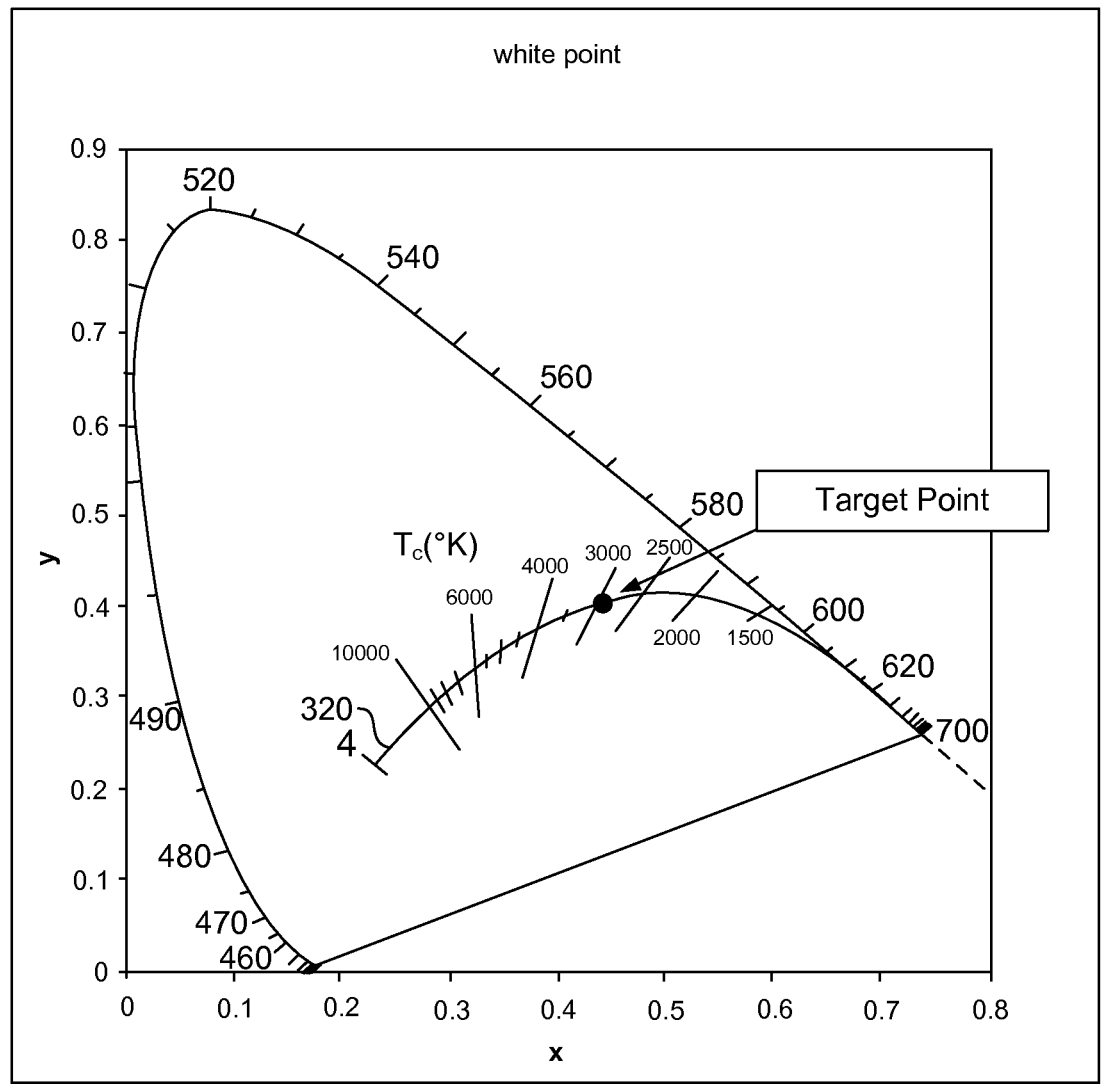
FIG. 3 is a color chart illustrating characteristics of light according to the CIE 1931 color space.

For example, FIG. 3 is an illustration of the International Commission on Illumination (CIE) 1931 color space, known to those skilled in the art. This color space is a plot of the entire gamut of human-perceivable colors according to a set of coordinates, that is, CIE x and CIE y coordinates. Line 320 shows the color coordinates of a black body radiator at the labeled temperature (i.e., a color temperature). In an exemplary embodiment, a target characteristic of the light is a correlated color temperature of approximately 3100K, or in another embodiment, a set of coordinates of CIE x=0.4±0.001, CIE y=0.4±0.001. As an example, assume that at block 260, a detected light included a set of coordinates of CIE x=0.2, CIE y=0.1. At block 270, the process determines that the detected light is off target, so the process branches to block 280, and the dispense ratio is adjusted. That is, the relative amounts of red, green, and yellow phosphors, and transparent silicone, are adjusted in order to move the color coordinates towards the target coordinates.

In an exemplary embodiment, an adjustment of the dispense ratio may make adjustments according to the position of the detected characteristic in relation to the color temperature line 320. For example, if the detected characteristic is below the color temperature line 320, the adjustment may include increasing the proportion of green phosphor. If the detected characteristic is above the color temperature line 320, the adjustment may include increasing the proportion of the red phosphor. Similarly, increasing the proportion of the yellow phosphor may move the light characteristic along the color temperature line in the direction of decreasing color temperature.

If the process determines that the light is sufficiently on target at block 270, the process may branch to block 290. In block 290, the process may determine whether the total amount of the phosphor composition dispensed onto the light emitting device meets or exceeds the target amount set in block 230. In various embodiments, this determination may be made by the controller 110, the dispenser 120, or another apparatus coupled to the light emitting device 150. Note that various embodiments may make decisions based on the dispensed amount being equal to (=), greater than (>), or greater than or equal to (≥) the target amount, or based on some other suitable relationship between the dispensed amount and the target amount. If the target amount has been reached, the process may end. Otherwise, the process may branch to block 240 for another iteration including dispensation of the phosphor, measurement of the characteristic of the light, and potentially, adjustment of the dispense ratio.

Those skilled in the art will comprehend the process illustrated in FIG. 2 is only one example of a process within the scope of this disclosure, and variations and modifications may be made without departing from the intended scope. For example, another process may add another step of determining whether the total amount of phosphor compound meets and/or exceeds the target amount after block 280, or at any other intermediate step within the process.

Further, the described order or sequence of steps is not necessarily the only possible implementation. For example, in some aspects the application of power to the light emitting device, and the detection of the characteristic of the light, are continuously performed concurrently with the dispensation of the phosphor compound onto the light emitting device. In certain aspects the application of power and detection of the characteristic of the light are not done continuously, nor are they done in any particular sequence, but they are done periodically, e.g., from every 100 ms to every 1 min., while the phosphor compound is dispensed onto the light emitting device, but independent of the timing of other process steps.

By utilizing the process according to the above description, the characteristics of the light emitted by the phosphor-coated light emitting device can be more precisely controlled, insuring that the color points or other characteristics of light emitted by a large number of devices will have low variability, thus reducing or eliminating the need for binning and improving production yield. Further, the necessity for pre-mixing the phosphor composition is reduced or eliminated, reducing the costs of production.

In the foregoing specification, the invention has been described with reference to a number of exemplary embodiments. Various modifications and changes may be made, however, without departing from the scope of the present invention as set forth in the claims and their equivalents. The specification and figures are illustrative, rather than restrictive, and modifications are intended to be included within the scope of the present invention. Accordingly, the scope of the invention should be determined by the claims and their legal equivalents rather than by merely the examples described.

For example, the steps recited in any method or process claims may be executed in any order and are not limited to the specific order presented in the claims. Additionally, the components and/or elements recited in any apparatus claims may be assembled or otherwise operationally configured in a variety of permutations and are accordingly not limited to the specific configuration recited in the claims.

Benefits, other advantages and solutions to problems have been described above with regard to particular embodiments; however, any benefit, advantage, solution to a problem, or any element that may cause any particular benefit, advantage, or solution to occur or to become more pronounced are not to be construed as critical, required, or essential features or components of any or all the claims.

As used herein, the terms "comprise," "comprises," "comprising," "having," "including," "includes" or any variation thereof, are intended to reference a non-exclusive inclusion, such that a process, method, article, composition or apparatus that comprises a list of elements does not include only those elements recited, but may also include other elements not expressly listed or inherent to such process, method, article, composition, or apparatus. Other combinations and/or modifications of the above-described structures, arrangements, applications, proportions, elements, materials, or components used in the practice of the present invention, in addition to those not specifically recited, may be varied or otherwise particularly adapted to specific environments, manufacturing specifications, design parameters, or other operating requirements without departing from the general principles of the same.

The previous description is provided to enable any person skilled in the art to fully understand the full scope of the disclosure. Modifications to the various configurations disclosed herein will be readily apparent to those skilled in the art. Thus, the claims are not intended to be limited to the various aspects of the disclosure described herein, but are to be accorded the full scope consistent with the language of claims, wherein reference to an element in the singular is not intended to mean "one and only one" unless specifically so stated, but rather "one or more." Unless specifically stated otherwise, the term "some" refers to one or more. A claim that recites at least one of a combination of elements (e.g., "at least one of A, B, or C") refers to one or more of the recited elements (e.g., A, or B, or C, or any combination thereof). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. An apparatus operable in a light-emitting-device-manufacturing system, the apparatus comprising:
    dispensing means configured to dispense a composition of a plurality of phosphors onto the light emitting device;
    sensing means configured to detect a characteristic of light emitted by the light emitting device;
    controlling means configured to adjust relative amounts of respective portions of the composition during dispensation to reduce a difference between the detected characteristic of the light and a desired characteristic of the light, determine whether the detected characteristic of light is within a predetermined range for the desired characteristic of the light,
    and iterate dispensing the adjusted composition, detecting the characteristic of light, and adjusting the composition while the detected characteristic of the light is outside of the predetermined range for the desired characteristic of the light,
    wherein the dispensing means is further configured to dispense the composition until the total dispensed phosphor composition is one of a predetermined weight or volume while the detected characteristic of the light is within the predetermined range.

2. The apparatus of claim 1, wherein the desired characteristic of the light comprises at least one of a correlated color temperature (CCT) or a set of coordinates in a color space.

3. The apparatus of claim 2, wherein the desired characteristic of the light comprises the CCT and the set of coordinates in the color space.

4. The apparatus of claim 1, wherein the respective portions of the phosphor composition comprise respective colors of phosphor suspended in silicone.

5. The apparatus of claim 4, wherein the dispensing means is further configured to dispense each respective one of the colors of phosphor utilizing a respective dispensing means configured to dispense a respective color phosphor.

6. The apparatus of claim 4, wherein the respective portions of the phosphor composition further comprise a substantially pure silicone.

7. The apparatus of claim 1, further comprising power means configured to apply a power to the light emitting device to emit light.

8. The apparatus of claim 7, wherein the power means is further configured to test light emitting devices at pulsed condition.

9. A system for dispensing a phosphor composition onto a light emitting device, comprising:
   a light sensor configured to detect a characteristic of light emitted from the light emitting device;
   a plurality of phosphor dispensers, each configured to dispense a respective color phosphor onto a surface of the light emitting device; and
   a controller configured to adjust relative amounts of the color phosphors during dispensation to reduce a difference between the detected characteristic of the light and a desired characteristic of the light and determining whether the detected characteristic of light is within a predetermined range for the desired characteristic of the light,
   wherein the controller is further configured to iteratively: control the phosphor dispensers dispense one or more of the phosphors, detect the characteristic of the light, and adjusts the relative amounts of the color phosphor while the detected characteristic of the light emitted from the light emitting device is outside of the predetermined range for the desired characteristic of the light, and
   wherein the controller is further configured to control the phosphor dispensers to dispense the one or more of the phosphors until one of a predetermined volume or a predetermined weight of the phosphor composition has been dispensed while the detected characteristic of the light is within the predetermined range.

10. The system of claim 9, wherein the phosphor dispensers are further configured to adjust a ratio of the respective color phosphors to dynamically reduce a difference between the detected characteristic of the light and a desired characteristic of the light while dispensing the respective portions of the phosphor composition.

11. The system of claim 10, wherein the phosphor dispensers are further configured to dynamically adjust a dispensing time and/or speed to reduce the difference between the detected characteristic of the light and the desired characteristic of the light while dispensing the respective portions of the phosphor composition.

12. The system of claim 9, further comprising a silicone dispenser for dispensing substantially pure silicone onto the surface of the light emitting device.

* * * * *